United States Patent
Welling

(10) Patent No.: US 11,278,958 B2
(45) Date of Patent: Mar. 22, 2022

(54) TRANSFER METHOD FOR MANUFACTURING CONDUCTOR STRUCTURES BY MEANS OF NANO-INKS

(71) Applicant: GIESECKE & DEVRIENT GMBH, Munich (DE)

(72) Inventor: Ando Welling, Isen (DE)

(73) Assignee: GIESECKE+DEVRIENT MOBILE SECURITY GMBH, Munich (DE)

( * ) Notice: Subject to any disclaimer, the term of this patent is extended or adjusted under 35 U.S.C. 154(b) by 0 days.

(21) Appl. No.: 14/706,613

(22) Filed: May 7, 2015

(65) Prior Publication Data

US 2015/0239044 A1 Aug. 27, 2015

Related U.S. Application Data

(62) Division of application No. 13/642,006, filed as application No. PCT/EP2011/001998 on Apr. 19, 2011, now Pat. No. 9,403,211.

(30) Foreign Application Priority Data

Apr. 20, 2010 (DE) .......................... 102010015659.0

(51) Int. Cl.
*B22F 3/10* (2006.01)
*B22F 7/04* (2006.01)
(Continued)

(52) U.S. Cl.
CPC .................. *B22F 3/10* (2013.01); *B22F 5/00* (2013.01); *B22F 7/008* (2013.01); *B22F 7/04* (2013.01);
(Continued)

(58) Field of Classification Search
CPC ......... B23F 3/10; B32B 37/025; B32B 38/10; H05K 1/097; H05K 1/187; H05K 3/202;
(Continued)

(56) References Cited

U.S. PATENT DOCUMENTS 5,407,511 A 4/1995 Nakatani et al.
6,049,461 A 4/2000 Haghiri-Tehrani et al.
(Continued)

FOREIGN PATENT DOCUMENTS

CN 1751546 A 3/2006
CN 101199245 A 6/2008
(Continued)

OTHER PUBLICATIONS

International Search Report from PCT Application No. PCT/EP2011/001998, dated Aug. 4, 2011.
(Continued)

*Primary Examiner* — Monique R Jackson
(74) *Attorney, Agent, or Firm* — Workman Nydegger

(57) ABSTRACT

A method for equipping a film material with at least one electrically conductive conductor structure, wherein a dispersion containing metallic nanoparticles in the form of a conductor structure is applied to a thermostable transfer material and the metallic nanoparticles are sintered to form an electrically conductive conductor structure. The electrically conductive conductor structure of sintered metallic nanoparticles is then transferred from the thermostable transfer material to the non-thermostable film material. A method for producing a laminate material using the film material using at least one electrically conductive conductor structure, and to the corresponding film material and laminate material are described.

15 Claims, 4 Drawing Sheets

(51) Int. Cl.
- *H01B 5/00* (2006.01)
- *H05K 1/09* (2006.01)
- *H05K 3/20* (2006.01)
- *G06K 19/073* (2006.01)
- *G06K 19/077* (2006.01)
- *B22F 5/00* (2006.01)
- *B22F 7/00* (2006.01)
- *H05K 1/18* (2006.01)
- *H05K 3/12* (2006.01)

(52) U.S. Cl.
CPC . *G06K 19/07345* (2013.01); *G06K 19/07718* (2013.01); *H01B 5/00* (2013.01); *H05K 1/092* (2013.01); *H05K 1/097* (2013.01); *H05K 1/181* (2013.01); *H05K 3/202* (2013.01); *H05K 3/207* (2013.01); *H01L 2224/48091* (2013.01); *H01L 2224/48227* (2013.01); *H05K 3/12* (2013.01); *H05K 3/1275* (2013.01); *H05K 2203/06* (2013.01); *H05K 2203/1131* (2013.01); *H05K 2203/1545* (2013.01); *Y10T 428/12014* (2015.01)

(58) Field of Classification Search
CPC ............... H05K 3/207; H05K 2203/06; G06K 19/07781; G06K 19/07718; C09D 5/24; H01B 1/22; B22F 3/10; B22F 5/00; B22F 7/008; B22F 7/04
See application file for complete search history.

(56) References Cited

U.S. PATENT DOCUMENTS

| | | | |
|---|---|---|---|
| 6,072,394 A * | 6/2000 | Hasegawa | G08B 13/242 29/25.42 |
| 6,379,745 B1 | 4/2002 | Kydd et al. | |
| 6,743,319 B2 * | 6/2004 | Kydd | H05K 3/207 156/230 |
| 6,839,963 B1 | 1/2005 | Haghiri-Tehrani et al. | |
| 7,456,752 B2 * | 11/2008 | Oberle | G01N 27/023 340/539.26 |
| 7,648,741 B2 | 1/2010 | Nguyen et al. | |
| 7,663,564 B2 * | 2/2010 | Ayala | G06K 19/07749 340/572.5 |
| 7,968,011 B2 * | 6/2011 | Overbeek | C09D 11/101 252/502 |
| 8,261,437 B2 * | 9/2012 | Yanagimoto | H05K 3/107 29/825 |
| 8,911,823 B2 * | 12/2014 | Li | C23C 24/08 427/191 |
| 8,926,933 B2 | 1/2015 | Zhang et al. | |
| 2001/0003438 A1 * | 6/2001 | Imaichi | G08B 13/2414 340/572.8 |
| 2003/0136503 A1 | 7/2003 | Green et al. | |
| 2003/0192584 A1 | 10/2003 | Beckenbaugh et al. | |
| 2005/0214480 A1 * | 9/2005 | Garbar | H05K 1/097 428/1.1 |
| 2006/0057827 A1 | 3/2006 | Huhtasalo et al. | |
| 2006/0072944 A1 | 4/2006 | Sharma et al. | |
| 2006/0189113 A1 * | 8/2006 | Vanheusden | C09D 11/30 438/597 |
| 2006/0254440 A1 | 11/2006 | Choi et al. | |
| 2006/0263725 A1 | 11/2006 | Nguyen et al. | |
| 2007/0035466 A1 * | 2/2007 | Coleman | G06K 19/07752 343/895 |
| 2007/0059901 A1 * | 3/2007 | Majumdar | H01L 51/0013 438/455 |
| 2007/0144305 A1 * | 6/2007 | Jablonski | B22F 1/0022 75/252 |
| 2007/0178232 A1 | 8/2007 | Kodas et al. | |
| 2008/0035740 A1 | 2/2008 | Tanner | |
| 2008/0169122 A1 * | 7/2008 | Shiraishi | C09D 11/52 174/257 |
| 2008/0308641 A1 | 12/2008 | Finn | |
| 2009/0191356 A1 | 7/2009 | Lee et al. | |
| 2010/0265307 A1 | 10/2010 | Linton et al. | |

FOREIGN PATENT DOCUMENTS

| | | |
|---|---|---|
| DE | 10 2005 020 099 A1 | 11/2006 |
| EP | 0 756 244 A2 | 1/1997 |
| JP | H06336096 A | 12/1994 |
| JP | 2004-247572 A | 9/2004 |
| WO | 2005/099326 A2 | 10/2005 |
| WO | 2005125290 A1 | 12/2005 |
| WO | 2006/076603 A2 | 7/2006 |
| WO | 2006/124320 A1 | 11/2006 |

OTHER PUBLICATIONS

International Preliminary Report on Patentability from PCT Application No. PCT/EP2011/001998, dated Oct. 23, 2012, 12 pages.
"DuPont KAPTON Polymide Film: General Specifications", Du Point, downloaded from www.dupont.com, Jan. 2017, 6 Pages.
Chinese Office Action from corresponding CN Application No. 2011800305080, dated Nov. 24, 2014.

* cited by examiner

TRANSFER METHOD FOR MANUFACTURING CONDUCTOR STRUCTURES BY MEANS OF NANO-INKS

BACKGROUND OF THE INVENTION

A. Field of the Invention

The subject matter of the present invention is a method for equipping a foil material with at least one electrically conductive conductor structure, a method for manufacturing a laminate material which has at least two layers made of foil material and at least one electrically conductive conductor structure between the layers made of foil material, as well as foil materials manufactured by means of the method according to the invention and laminate materials having at least one electrically conductive conductor structure. Subject matter of the present invention are also products manufactured with the foil material and laminate material of the invention, such as for example security documents with electrically conductive security features, and such as electronic circuit units having IC-chip and coil for applications such as contactless data carriers in the form of flat material, as well as foil circuit elements which can be formed as a card body of a chip card or can be integrated in a chip card or in any other flat material.

B. Related Art

The contactless data transmission is increasingly gaining in importance, for example for the purposes of checking and controlling goods, for marking goods of the most different kind in order to avoid forgery or theft, and in particular also for electronic ID documents. The data carrier here typically is an IC-chip with antenna. The chip consists of a plurality of electronic components, and the antenna is an electrically conductive layer, typically in the form of a coil. The stored information can be read-out and displayed for example on a display or cause certain mechanical reactions, for example releasing or blocking the access to a certain region of a building. It is desirable to keep the contactless circuit units as small and in particular as flat as possible so that they can be attached in the form of labels to the surface of objects or integrated as inlets in the layer construction of a card, for example of an ID document, or of any other flat object.

Such a circuit unit is known for example from EP 0 756 244 A2. The disclosed circuit unit comprises at least one insulating carrier substrate on which there is located a conducting, flat coil, and an integrated circuit whose connection points are conductively connected with the coil ends directly or via contacts or are capacitively coupled thereto. On the insulating carrier material there are applied coil layers alternately to insulating layers, wherein each insulating layer has at least one passage through which the adjacent coil layers are conductively interconnected, or wherein the adjacent coil layers are capacitively coupled, so that the individual coil layers yield a coil. The coil layers are preferably printed on with a conductive lacquer or are sprayed on using a corresponding mask or are etched out of a conducting coating located on the carrier material. Other known manufacturing methods are, for example, applying the coil in the form of an electrically conductive coating through a hot stamping method to the carrier material, or punching out the coil of a metal foil or an electrically conductive coated plastic foil and applying it to the carrier material.

A preferred method for manufacturing coil layers and other conductor structures is an etch-free screen printing method, wherein a printing paste with a conducting material is printed on. After the printing, the carrier material is subjected to a heat treatment, in order to remove volatile components of the printing paste.

It is also often desired to activate or to deactivate, i.e. to switch on and off, electronic functional elements, such as chip modules. For this purpose, foil switching elements or foil push-buttons are known. For manufacturing a foil switching element, several foil layers, between which a switching contact is to be established, are put one on top of the other and glued to each other. Here, between two electrically conductive switching foils (contact foils) there is arranged a perforated and electrically insulating intermediate foil, which serves as a spacer and prevents the contact foils from touching each other in the resting state of the foil switching element. The intermediate foil thus effects that the foil switching element is open in the resting state. Through the exertion of pressure on at least one of the two contact foils in the region of the perforation of the intermediate foil, the contact foil is deformed and an electrical contact is established between the two contact foils. If no more pressure is exerted, the contact foil takes on again its original form, as a result of its elasticity. Thereby, the electrical contact between the two contact foils is interrupted. The foil switching element therefore closes the conductor circuit only during the exertion of a pressure on at least one of the two contact foils and opens it upon decrease of the pressure.

The contact between the switching foils of the "switch" and the connection of the switch to the functional elements is established through electrically conductive conductor structures. These structures can be produced in the same way as the above-mentioned flat coils, the production by printing technology being preferred.

Particularly preferably, for the manufacturing of the conductor structures, such as conductor paths, conductive areas and contact areas, pastes with metallic particles are employed, for example silver conductive pastes having silver particles, which are printed on the foils. Here, the problem arises that circuit units and foil switching elements, which are suitable for the integration into chip cards or for foil keyboards or other flat objects, normally consist of plastic foils, that is, the conductor structures must be formed on plastic foils, whereby the foils, moreover, often are thin with thicknesses in the range of about 50 µm to 300 µm. Such plastic foils, however, at higher temperatures are susceptible to distorting, curling and in the worst case shrinking. This property restricts the possibilities of producing flat conductor structures on plastic foils. Structures printed on by means of conductive pastes having metallic particles can only be dried at moderate temperatures, in the case of the usual carrier foils, such as for example PVC and amorphous PVC, at a maximum of 50° C.; polycarbonate, biaxially oriented polyester and paper are suitable for temperatures of about 100° C. The same applies to paper-based materials, as they are employed for security papers and value documents, for example for banknotes. Such value documents often have security features, the check criterion of which is the electrical conductivity. Mostly, it is desired to incorporate the security features in inconspicuous fashion. Manufacturing narrow, flat, inconspicuous conductor structures on or in substrates that are not temperature-resistant, as they are employed for value documents, however, is practically impossible.

At temperatures applicable to usual plastic foils and paper-based foils, there cannot take place a sintering of the metal particles forming the conductor structures. The result is a poor electrical conductivity in comparison to solid metallic conductor structures and a high metal consumption, in order to achieve an acceptable conductivity. Since the conductor structures are manufactured preferably with precious metals, such as silver, a high metal consumption simultaneously causes high costs. Furthermore, relatively high conductor structure thicknesses are required. Nevertheless, the achieved electrical conductivities still need to be improved. With silver conductive pastes there can be achieved values of at best about 1/10 of the conductivity of solid silver, typically much less, about 1/20 of the conductivity of solid silver.

Therefore, there is a need of an improved method for producing electrical conductor structures on foil materials, in particular for producing electrical conductor structures for electronic circuit units and other elements having electrically conductive conductor structures, which elements are integratable in flat materials, such as chip cards.

SUMMARY OF THE DISCLOSURE

It is therefore the object of the present invention to provide such a method. The method should offer a combination of as many as possible, preferably all, of the following advantages:
- it should allow the formation of conductor structures on non-temperature-stable carrier substrates, such as plastic foils or foil materials;
- it should allow the formation of conductor structures having a good electrical conductivity;
- it should allow the formation of flat conductor structures;
- the necessary material consumption should be low;
- the process duration should be short;
- it should be possible to check the electrical conductivity of the conductor structures prior to their further processing into an end product.

It is also an object of the present invention to provide a method for manufacturing a laminate material having electrically conductive conductor structures, as well as the corresponding foil materials and laminate materials.

It is furthermore the object of the present invention to provide flat materials having such conductor structures, which are equipped or can be equipped with functional elements, such as an IC-chip, and which are suitable to be integrated into a card construction.

It is moreover the object of the present invention to provide cards having such conductor structures and electronic functional elements, such as contactless data carriers.

The central idea of the present invention is to produce electrically conductive conductor structures by means of so-called "nano-inks", to produce these conductor structures, however, not on the final carrier material, but on a temperature-stable intermediate carrier, and to then transfer them onto the final carrier material that does not need to be temperature-stable.

As already mentioned above, chip cards and laminate materials having electronic circuit units, which are suitable for the integration into chip cards and other flat materials, for example foil keyboards, typically consist of plastic foils, in particular of hot-laminatable plastic foils. Materials are for example thermoplastics such as polyesters, polycarbonates, polyolefins, polyamides, fluoropolymers and vinyl polymers, preferably PVC. Upon the formation of electrically conducting structures on the foils typically employed for the stated purpose, it is to be taken into account that the foils are not temperature-stable, that means that in case of a too strong heating they decompose in the worst case, but at least soften and lose their form thereby. A deformation of the foils having the conductor structures, however, needs to be absolutely avoided, in particular since otherwise register problems occur. A comparable problem occurs with foil materials made of paper or of paper/plastic mixtures as they are employed for value documents, for example banknotes. These foil materials, too, cannot be exposed to high temperatures without changing, for example, curling or decomposing.

A preferred method for manufacturing conductor structures on foils for card constructions therefore consists at present in applying conductive pastes having metal particles, for example having silver particles, to the foils in the form of the desired conductor structures by the screen printing method, then drying the foils at a temperature of no more than 50° C., typically in the tunnel drier of the screen printing system, and subsequently connecting the dried foils having conductor structures into a laminate material through hot lamination. In the finished conductor structures of the laminate material the metal particles are present as mutually contacting individual particles. The electrical contact, and thus the electrical conductivity, between mutually contacting individual particles is considerably worse than it would be the case with a continuous conductor structure, for example with a conductor structure etched out of a solid metal layer. Hence, in order to achieve a reasonably acceptable conductivity, relatively thick conductor structures must be formed. High material consumption and therefore high costs are the consequence.

According to the invention, there has now been found a way to achieve, despite the employment of non-temperature-stable carrier materials, a sintering of the metal particles of the conductive pastes and thus a considerably better conductivity.

According to the invention, as conductive pastes there are employed nano-inks. Nano-inks are aqueous suspensions or solvent-based suspensions of metallic particles which have particle diameters in the range of some 10 nm, typically 20 nm to 1000 nm. Metallic particles are particles of pure metals or of metal alloys, preferably silver particles, aluminum particles and particles of copper-nickel alloys. The content of nanoparticles in the suspensions is for example 10 wt % to 30 wt %, the content being primarily determined by the desired application method. Suitable application methods are in particular printing methods, preferably screen printing, flexographic printing, aerosol printing, inkjet printing and gravure printing. Particularly preferred is a screen printing method. Here, relatively high particle concentrations can be present, for example about 40 to 60 wt % metallic nanoparticles.

Suitable nano-inks are available from Bayer, for example the nanosilver dispersion Bayink TP S, with a silver content of 20 wt %, and the nanosilver and nanoaluminum dispersions of NovaCentrix. The standard nanosilver dispersions have particle diameters of 25 nm or 35 nm. However, dispersions with particle sizes of 10 nm to 100 nm are also available.

The nanoparticles have the advantageous property that they are sinterable at much lower temperatures than the particles of conventional conductive pastes. Customary conductive pastes have for example an average particle size of 2 μm, but here there are large variances. "Sintering" is understood to mean a superficial baking together of the individual particles, possibly, with superficial fusing. By the baking together, the electrical contact and thus the electrical conductivity is considerably improved compared to merely mutually contacting individual particles. There arises a quasi transition state between individual particles merely physically mutually contacting and a conductor path of solid material. It holds approximately that the electrical conductivity of the conductor structure is the better the higher the sintering temperature of the nanoparticles is.

Silver-nanoparticles sinter at a temperature of about 150° C. This sintering temperature of the nanoparticles, however, is still much too high for conductor structures, which are printed on plastic foils, as they are employed for laminate materials made of or with hot-laminatable foils, or on paper, to be able to be exposed to these temperatures. The foil materials would be drastically distorted thereby, be curled or even be decomposed. The decomposition of commercially available hot-laminatable foils begins, for example already at 160° C.

According to the invention, the sintering of the nanoparticles is therefore not effected on their final carrier material, but on a temperature-stable intermediate carrier. The method according to the invention for equipping a foil material with conductor structures therefore has two basic method steps, namely the production of the conductor structure on a temperature-stable transfer material, on the one hand, and the transfer of the conductor structure onto the desired final carrier material, typically a non-temperature-stable foil, on the other hand, wherein a foil is understood to be flat materials of arbitrary dimensions, for example in band form or web form, and of arbitrary composition, typically made of plastics and/or paper. The flat materials are usually thin, i.e. they have thicknesses of 500 µm or less, typically 100 µm or less.

"Not temperature-stable" means that the final carrier material would not withstand the sintering process of the nanoparticles in unchanged form, but would change its shape and/or physical properties and/or chemical properties. Whereas a "temperature-stable" material suffers no changes at the minimum temperatures of about 150° C. necessary for the sintering.

For producing the conductor structure or the conductor structures on the temperature-stable transfer material, there is first applied onto a surface of the transfer material a dispersion containing metallic nanoparticles, in the following referred to as "nano-ink", in the form of the conductor structure to be formed, but mirror-inverted to the final conductor structure, since the transfer process onto the final carrier material causes a mirroring of the conductor structure. The result is a precursor conductor structure of metallic nanoparticles which are mutually touching, at least after the removal of the carrier medium by drying.

The transfer material can have for example the form of an endless band, which is led in a circle and continually re-used, or it can be a band which is unwound from a storage roll and wound onto another storage roll after it has been used, with or without conductor structure(s), or it can have the form of a roller or a plate. Forms, which make possible a continuous conducting of the process, such as bands or rollers, are preferred.

Suitable transfer materials are materials, to which the nano-inks do not adhere too strongly, because the sintered conductor structures must again be stripped off of the transfer material, on the one hand, and which are not impaired by the necessary sintering temperatures, on the other hand. The transfer material does not need to be electrically insulating, since it is no longer present upon the use of the conductor structures.

Possible transfer materials are primarily metals, metal alloys and high temperature-resistant plastics. Suitable metals and metal alloys are for example preferably steel or aluminum, also metallic or coated with polymers, in order to produce optimized stripping or transfer properties. Suitable plastics are all those plastics which have long-term use temperatures of over 150° C. Preferably, the plastics have long-term use temperatures of at least 200° C., more preferably at least 230° C., and particularly preferably 250° C. and higher. Such plastics are for example some fluoropolymers and polyimides, wherein Kapton (DuPont), which is heatable to 400° C., is especially preferred. Also perfluoroalkoxy polymers, which have long-term use temperatures up to 260° C., are very suitable.

Also combinations of metals or metal alloys and plastics can be used, for example bands or rollers of metal with a plastic coating or bands or rollers of a different material with a coating of metal or plastic. Many high-temperature-resistant plastics, in particular perfluorinated polymers, have the advantage that their adhesion force to other materials is low. This means that they have good release properties for the sintered conductor structures, which facilitates the transfer thereof.

The way of application of the nano-inks in principle is arbitrary, but preferably the nano-inks are printed. The selection of the optimum printing method primarily depends on the kind of nano-ink to be employed or its content of nanoparticles. Examples of nano-inks and suitable application methods have already been mentioned.

The nano-ink is applied in the form which the finished conductor structure is to have. This conductor structure is formed of the precursor conductor structure produced by means of the nano-ink, through sintering.

The sintering of the precursor conductor structure is effected by supplying heat, i.e. by heating the precursor conductor structure to a temperature which is sufficient for at least partly sintering the metallic nanoparticles.

The temperature must therefore reach at least 150° C., and since the sintering is the better the higher the temperature, it is preferred to sinter at least 200° C., particularly preferably at least 230° C., and in particular at 250° C. or higher. The sintering can be effected for example by the transfer band being led through a furnace, or by irradiation with infrared radiation. A sintering by means of laser is also possible. When employing a roller as a transfer material, primarily IR sintering or laser sintering come into consideration.

Since with the method according to the invention there can be applied relatively high sintering temperatures, the sintering is effected within a short time span, i.e. within 30 seconds, preferably within 15 seconds, particularly preferably within 10 seconds or less. In case of particularly high-temperature-resistant transfer materials, such as Kapton, sintering times of under 5 seconds can be achieved. The very short sintering times bring along an altogether short process duration.

In particular with very high sintering temperatures it can be advantageous to briefly dry the precursor conductor structure before the sintering process, i.e. to remove the dispersion medium. The drying can be effected on the way to the sinter station for example by IR-treatment, whereby the radiated energy is to be suitably determined so as to avoid a damage to the precursor conductor structure by a suddenly starting evaporation of the dispersion medium.

After the sintering of the metallic nanoparticles forming the precursor conductor structure, now an excellently electrically conductive conductor structure is present on the surface of the transfer material. In a next step, this conductor structure is transferred onto the final carrier material. Since the final carrier materials are preferably hot-laminatable foils which are not temperature-stable, the transfer material having the conductor structures thereon is cooled down to a temperature which is compatible with the temperature resistance of the final carrier material, before it is brought in contact with the final carrier material. Preferably, cooling down is effected to a temperature of 50° C. or below. The cooling down can be effected simply by the transfer material having to run through a sufficiently long path length between sinter station and transfer station, or it can be supported by equipment, for example by a slight airflow.

The conductor structures produced in this way on the transfer material have, due to the sintering of the nanoparticles, a very good electrical conductivity, which lies approximately in the range of 20% to 50% of the conductivity of the corresponding solid material. The conductor structures can therefore be very flat, that is, have thicknesses in the range of about 1 to 25 µm, preferably of about 2 to 10 µm.

The conductor structures are now transferred from the temperature-stable transfer material, which may or may not be electrically insulating, to the final, electrically insulating carrier material. Electrically insulating means in this context that the electrical conductivity of the final carrier material is negligibly low in comparison to the conductor structures. The ratio of the conductances of the conductor structures to the conductances of the electrically insulating carrier foils should be about 1:1,000,000, preferably 1:1,000,000,000. The final carrier materials, of course, can also be temperature-stable, but normally the method of the invention for attaching conductor structures to non-temperature-stable foil materials will be employed, for example, for attaching conductor structures to the hot-laminatable foil materials favored for manufacturing laminate materials for chip cards, such as polyester foils, polycarbonate foils, polyolefin foils, polyamide foils and other thermoplastic foils. A foil material particularly preferred as a final carrier material is PVC.

The transfer of the conductor structures from the transfer material onto the final foil material can be effected immediately after the manufacturing of the conductor structures and, where applicable, the cooling down of the transfer material. When the transfer material is a roller or is located on a roller in the form of a coating, clothing, etc, an instantaneous transfer is the only expedient possibility. In case of a transfer material in band form or web form or in the form of individual transfer material sheets it is also possible, however, to perform the transfer at a later point in time. The transfer material with the conductor structures formed thereon is then wound or stacked and can be temporarily stored and/or transported. It constitutes an intermediate product in the manufacture of a foil material having electrically conductive conductor structures.

For transferring an electrically conductive conductor structure from the transfer material onto the final carrier foil, the transfer material and the final carrier foil are brought together such that the conductor structure to be transferred is located between mutually touching surfaces of transfer material and final carrier foil. By exerting a pressure on the layer of transfer material/conductor structure/foil material, the conductor structure is transferred from the transfer material onto the foil material, as it has a greater adhesive force to the foil material than to the transfer material. This difference in the conductor structures' adhesive force to the transfer material, on the one hand, and to the foil material, on the other hand, is decisive for a successful transfer of the conductor structures. Therefore, there are preferably taken measures, in order to achieve as great a difference in the adhesive forces as possible. Such a measure is to wash off the transfer material with a surfactant solution before use, or to equip it with a release coating. Such release coatings are known. Suitable are for example Teflon and silicone coatings or certain nanoparticle coatings. Here it is decisive that the surface tension of the substrate still permits a sufficient wettability through the nano-ink. Another possibility is to pretreat or to coat the final foil material in adhesion-enhancing fashion. An adhesion-enhancing pretreatment is for example a corona treatment, and an adhesion-enhancing coating is a coating with an adhesive. Suitable adhesives are in particular adhesives activatable by pressure and/or heat, which without activation are tack-free. Tack-free means in this context that the foil material having the adhesive coating can be rolled or stacked and stored without sticking together. Suitable adhesives are for example polyamides, polyurethanes or combinations thereof, which for a thermo-activatability are covered with protective groups. The measures can be applied individually or in combination.

A further possibility to promote the transfer of the electrically conductive conductor structures from the transfer material onto the final foil material is to heat the foil material. Heated thermoplastic foils exert a greater adhesive force on the conductor structures than non-heated foils, and a slight heating of the foil material is often already sufficient in order to ensure a satisfactory transfer of the conductor structures. Of course, the heating must not be so strong that the foil material would be impaired thereby, i.e. would distort or even decompose. Since the foil material in the moment of the transfer is spatially fixed, it is relatively temperature-tolerant. A heating to 50, 60 or 70° C. is usually not a problem.

A particularly good adhesion to the foil material can also be achieved by means of special nano-inks which have a proportion of adhesive-like materials. Suitable are for example nano-inks having an acrylate epoxy matrix.

The transfer can be effected in principle in every device which is suitable for exerting pressure on the materials brought together and, where applicable, for supplying heat to these. For example a press would come into consideration, where applicable, with heatable plates, but preferably the transfer is carried out between two rollers, which makes possible a continuous conducting of the process. If during the transfer also a heating is to be performed, it is preferred to realize one or both rollers, in particular the roller at the side of the final foil material, in heatable fashion. When the transfer material is formed as a roller, the transfer material itself represents one of the two rollers, through which the foil material is led for transferring the conductor structures. If the transfer material is a band or a web, i.e. a "wide" band, on which several conductor structures can be formed side by side, the transfer material and the final foil material are brought together in a separate transfer device. This transfer device consists preferably of roller and counterpressure roller.

The final foil material has preferably the form of bands, webs or sheets. It should, of course, be at least so wide that all the conductor structures formed on the transfer material, where applicable, conductor structures formed side by side, can be completely transmitted.

After the transfer of the conductor structures onto the final carrier material, the single copies of the desired size are detached therefrom. Although it is in principle also possible to manufacture each of the single copies individually, this way of manufacturing is less preferred due to its cumbersomeness and elaborateness. It is particularly preferred to employ a band-shaped or web-shaped transfer material, since such a transfer material offers the greatest freedom in conducting the process. In particular, the path lengths which are required for the sintering and, where applicable, for a predrying before the sintering and/or for a cool down after the sintering, can be freely selected here depending on the requirements. In addition, it is possible to decouple the two main method steps of the method of the invention from each other, namely the manufacturing of the conductor structures on the transfer material, on the one hand, and the transfer of the conductor structures onto the final foil material, on the other hand. The transfer of the conductor structures from the transfer material onto the final foil material can be effected temporally and locally independently of the manufacturing of the conductor structures on the transfer material.

The foils equipped with conductor structures or with at least one conductor structure can now be combined with further foils, which likewise have, where applicable, one or several conductor structures, into a laminate material. Some exemplary embodiments of laminate materials according to the invention are represented in FIGS. 4 to 9. The preferred lamination method is hot lamination. Preferably, for manufacturing the foil composite of the laminate material, exclusively hot-laminatable foils are employed, but foils which are not hot-laminatable can in principle also be employed as well. When the foils have a too high softening point for the hot lamination process carried out, there must be provided between the corresponding foil and the adjacent foil or the adjacent foils a suitable adhesive, such as a hot-melt adhesive, so that, as with hot lamination, a connection in material-locking fashion is produced between the foils. Preferably, as cover layers of the foil composite material, foils are laminated on or lined on which serve as protective layers, improve the moisture resistance, or are electrostatically chargeable. The laminated-on or lined-on foils can also be populated with electronic components or other elements. All materials can be, as desired, light-transmissive or opaque and, where applicable, colored. It is evident that all foils which are in contact with conductor structures must be electrically insulating. The individual foils can extend in each case all-over the entire laminate material, but it is also sufficient when they have suitable dimensions so as to separate adjacent conductor structures in an insulating fashion. This means that with the method according to the invention for equipping a foil material with conductor structures, this foil material not necessarily must be formed all-over, but in many cases already has the through openings desired in the later laminate materials.

The lamination is preferably effected between lamination plates of a laminating press at a temperature, depending on materials, of about 100° C. to 150° C., but for example can also be carried out between two lamination rollers. The lamination can be carried out with laminate materials having the desired final dimensions, but preferably sheet materials having a multitude of single copies, which are later cut to the desired dimensions, are laminated to each other. The foil material having conductor structures obtained according to the method of the invention, which is preferably manufactured in band form or web form, accordingly is cut, for lamination, to the desired sheet material dimensions. The lamination can be performed in such a way that all the foils of the laminate material to be manufactured are laminated in one single working process into a foil composite, or that two or more partial foil composite materials are manufactured which then are laminated or lined to each other in a further working process into the desired laminate material.

The obtained laminate materials can be already finished cards, but typically are inlets which are to be integrated into a card construction. When an inlet has the same dimensions as the card itself, it extends over the entire surface of the card, and in the card construction there do not occur thickness variations. It is therefore preferred to manufacture the laminate materials of the invention in the dimensions of the card or of the other flat material element into which they are to be integrated.

The laminate materials having conductor structures, according to the invention, can be combined in a per se known manner with electronic functional elements and then form for example electronic circuit units for the contactless data transmission or foil keyboards. In particular, there can be manufactured conductor structures in one or in several layers, which act as antennas in a circuit unit for the contactless data transmission, or which form a switch and switch on or off electronic functional elements in the same or in different levels of a laminate material.

The construction of such circuit units is per se conventional with regard to materials (of course, apart from employing nano-inks and equipping the foil material with conductor structures by means of transfer method), with regard to the required layer constructions, where applicable with regard to a through-contacting between the layers, and with regard to the connection with electronic functional elements. In this context, particular reference is made to the European patent application 0 756 244 A2.

DESCRIPTION OF THE DRAWINGS

The invention will hereinafter be illustrated further on the basis of Figures. It is pointed out that the Figures are not true to scale and not true to proportion. Further, the features represented in a Figure are not only applicable in combination with the other features represented in the corresponding Figure. Rather, features described in the context of a particular embodiment can be applied in general with the laminate material according to the invention. The same reference numbers designate the same or corresponding elements. There are shown.

DETAILED DESCRIPTION OF PREFERRED EMBODIMENTS OF THE INVENTION

Figure 1:
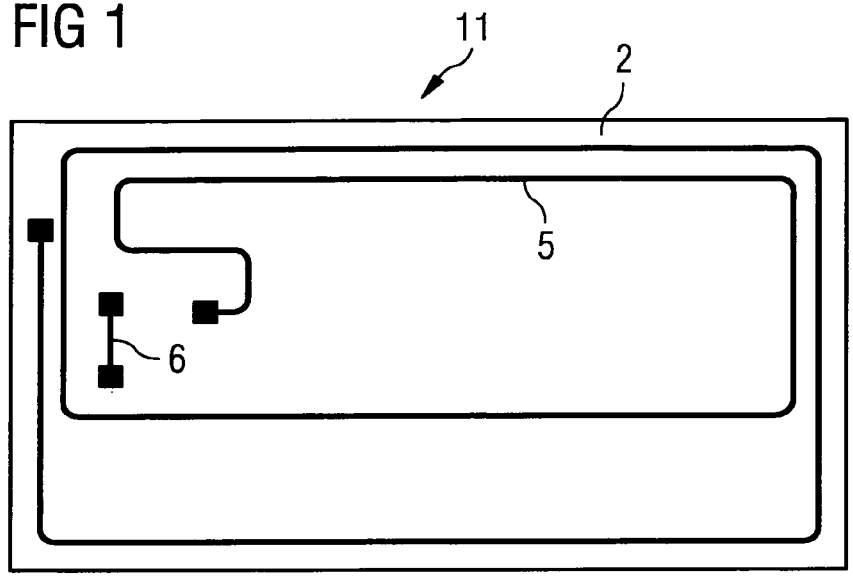
FIG. 1 a laminate material according to the invention in a top view.

FIG. 1 shows a laminate material 11 according to the invention in a top view. The laminate material 11 has a layer made of a first foil material 2, i.e. a first foil layer 2, and a layer made of a second foil material, i.e. a second foil layer. The second foil layer is transparent and therefore not recognizable in the Figure, so that a first conductor structure 5 and a second conductor structure 6 are visible between the foil layers. The conductor structure 5 is connected with the conductor structure 6, for example the conductor structure 6 is connected with the left end of the conductor structure 5. The ends of the conductor structures 5, 6 for connection with an electronic functional element, such as an IC-chip, are respectively shown in a broadened fashion. The IC-chips themselves are omitted in the schematic representation. The first conductor structure 5 is a conductor path in the form of a coil, as is required for data carriers for the contactless data exchange or for the contactless energy supply. For manufacturing the laminate material 11, a nano-ink, for example a suspension having silver nanoparticles, is printed onto a surface of a transfer material, for example by screen printing method or by flexographic printing method. The nano-ink is respectively applied in a shape corresponding to the shape of the desired conductor structures 5, 6. In so doing, precursor conductor structures are formed which consist of individual nanoparticles. The transfer material having the precursor conductor structures is now dried, preferably by leaving the nano-ink's carrier medium to evaporate during the transport of the transfer material having the precursor conductor structures to the sinter station.

In the sinter station, for example a tunnel furnace through which the transfer material is led, the silver nanoparticles are subjected to a sintering process at a temperature of for example 250° C. In so doing, from the first precursor conductor structure there results the first conductor structure 5 and from the second precursor conductor structure there results the second conductor structure 6. Subsequently, the transfer material having the conductor structures 5, 6 is left to cool down and then it is brought together with the first foil material 2. The bringing together is effected for example in the roller nip of two rollers forming a transfer station. In the roller nip, the conductor structures 5, 6 are transferred from the transfer material onto the first foil material 2. The first foil material 2 is then covered with a second foil material on the surface on which now the conductor structures 5, 6 are located, and the two foil materials are laminated into the laminate material 11. In the foil material 11 the conductor structures 5, 6 are enclosed in protected fashion between the first foil layer 2 made of the first foil material and the second foil layer made of the second foil material.

Figure 2:
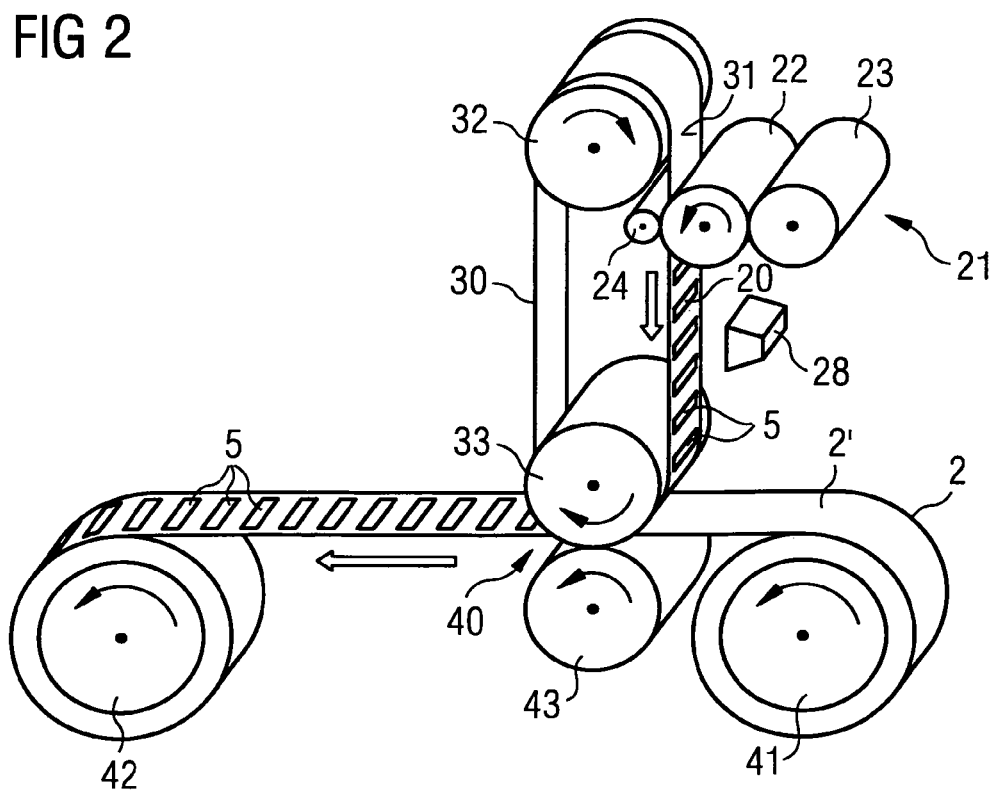
FIG. 2 a schematic representation of an embodiment of a device for carrying out the method according to the invention for equipping a foil material with at least one electrically conductive conductor structure, FIG. 3 a schematic representation of a different embodiment of a device for carrying out the method according to the invention for equipping a foil material with at least one electrically conductive conductor structure, FIG. 4 a chip card according to the invention in a top view, FIG. 5 the chip card of FIG. 4 in a perspective view, FIG. 6 a cross-section along the line A-A of FIG. 5, FIG. 7 a partial sectional view of a laminate material according to the invention with a switch in an exploded view, FIG. 8*a*, 9*a* respectively top views from below onto a conductor structure of the switch of FIG. 7, and FIG. 8*b*, 9*b* respectively top views from above onto conductor structures of the switch of FIG. 7 opposing the conductor structure of FIG. 8*a*, 9*a*.

FIG. 2 illustrates the carrying out of the method according to the invention. A transfer material band 30 with a surface 31 is led in a circle by transport rolls 32, 33 which are driven by a not shown drive. The transport material band consists for example of a high-temperature-resistant plastic such as Kapton. The arrows in the rolls 32, 33 state the sense of rotation of the rolls. A flexographic printing unit 21 is schematically indicated by a printing cylinder 22 with printing plates, a nano-ink transfer roller 23 and a counterpressure roller 24. By means of the printing unit 21 precursor conductor structures 20 are printed onto the surface 31 of the transfer material band 30. The precursor conductor structures 20 are printed in the form and arrangement in which they are to be present later on the final carrier material, however, mirror-inverted, since the transfer process onto the final carrier material causes a mirroring of the structures. In FIG. 2, the precursor conductor structures 20 are schematically drawn as rectangles, however, the structures of course can have any forms. There can also be arranged several precursor conductor structures 20 side by side, which requires an accordingly greater width of the transfer material band 30, i.e. a transfer material web.

The transfer material 30 is continuously transported in the direction of the arrow, whereby the precursor conductor structures 20 reach a sinter station 28. The sinter station 28 is for example a tunnel furnace through which the transfer material band is led, or an IR radiator or another heat source. Before reaching the sinter station 28 the precursor conductor structures 20 consist of metallic nanoparticles in a carrier medium, the carrier medium evaporating to a more or less strong extent on the transport path between printing unit 21 and sinter station 28. If a complete evaporation is desired, a sufficiently long transport path can be ensured, for example by a meandering guidance of the path of the transfer material band 30 or by an additional heat source between printing unit 21 and sinter station 28. In the sinter station 28 the precursor conductor structures 20 are heated to a temperature which is sufficient for the sintering of the metallic nanoparticles. Preferably, the upper limit of the long-term use temperature of the transfer material is selected to be the sintering temperature, since the sintering and thus the conductivity of the final conductor structures is the better the higher the sintering temperatures are. Furthermore, the sintering time is the shorter the higher the sintering temperature is. In the case of silver nanoparticles and a sintering temperature of about 250° C., the sintering process lasts only a few seconds. After the sintering there are no longer present metallic nanoparticles which mutually contact merely physically, as in the precursor conductor structures 20, but there have been formed continuous metallic structures with correspondingly good conductivity.

These "finished" conductor structures 5 are now transported further, in order to be transferred onto their final carrier material. The final carrier material 2, for example a PVC foil, is not temperature-stable, which is why the transfer material band 30 having the conductor structures 5 must be sufficiently cooled down before the contact with the final carrier material 2. Cooling down is effected automatically on the transport path or by a (not shown) cooling device between the sinter station 28 and the transfer station 40. In the represented embodiment, the transfer station 40 consists of the transport roll 33 of the transfer material band 30 and a counterpressure roller 43. The foil material 2, onto the surface 2' of which the conductor structures 5 are to be transferred, is located on a storage roll 41, is unwound from this storage roll and led through the roller nip of the transfer station 40, and is finally again wound onto a further roll 42. The arrows respectively indicate the movement directions. The foil material 2 expediently has about the same width as the transfer material band 30, in the represented embodiment a width which does not allow a side-by-side arrangement of precursor conductor structures 20 or conductor structures 5. The foil material 2 is represented as a continuous foil, but the foil material can also have through openings depending on the later purpose of use.

The transfer material band 30 having the conductor structures 5 on its surface 31 and the foil material 2 are contacted with each other in the roller nip of the transfer station 40 such that the conductor structures 5 touch the surface 2' of the foil material 2. Through the pressure exerted in the roller nip, they are pressed onto the surface 2' and remain adhered thereto. This adhesion is supported by a heated counterpressure roller 43, which slightly heats the foil material 2, for example to a temperature of about 50° C., and thus gives to the surface 2' a greater adhesive force. When the foil material 2 and the transfer material band 30 are again separated from each after leaving the roller nip, the conductor structures 5 are located on the surface 2' of the PVC foil, while the transfer material band 30 is again free of conductor structures and can anew be printed with precursor conductor structures 20. The PVC foil 2 equipped with conductor structures 5 is wound onto the storage roll 42 or, alternatively, immediately after the equipment with conductor structures 5 cut into segments having dimensions, as they are suitable for the later lamination into a laminate material.

In the embodiment represented in FIG. 2, the transfer material 30 has the form of an endless band, which causes that the manufacturing of the conductor structures 5 on the transfer material 30 and their transfer onto the foil material 2 expediently must be carried out in direct succession, i.e. in a combined system. Alternatively, it is also possible, however, to feed the transfer material band 30, similar to the foil material 2, from a storage roll, to form thereon the conductor structures 5, and to then again wind the transfer material band equipped with the conductor structures 5 onto a storage roll, in order to employ it for transferring the conductor structures 5 onto a foil material 2 only at a later point in time and in another system. In such an embodiment the transfer material band 30 would be fed to the transport roll 32 by a transfer-material storage-roll, and instead of or after the transport roll 33 there would be a further storage roll, onto which the transfer material band having the finished conductor structures 5 would be wound.

The foil material 2 can be equipped with conductor structures also on its two surfaces. For this purpose, for example the counterpressure roller 43 could be replaced by a further arrangement of transfer material, printing unit and sinter station.

Figure 3:
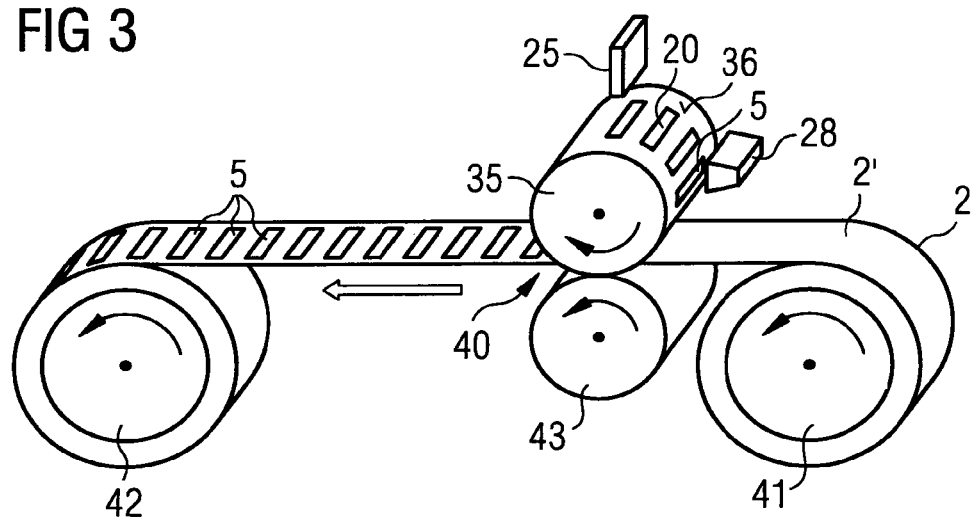

FIG. 3 shows an alternative embodiment of the transfer material. In the embodiment represented in FIG. 3, the transfer material has the form of a roller 35 with a surface 36 on which the precursor conductor structures 20 are printed. The roller 35 can consist for example of metal or of a high-temperature-resistant plastic, such as Kapton, or there can also be employed a metal roller which is coated with a high temperature-resistant plastic. The transfer material roller is rotated by means of a not shown drive. Instead of the flexographic printing unit 21 of FIG. 2, in the embodiment of FIG. 3 there is employed an inkjet printer, which is schematically indicated as a printhead 25. The employment of a roller-shaped transfer material allows less degrees of freedom in carrying out the method than the employment of a band-shaped or web-shaped transfer material. As it is directly apparent from FIG. 3, the transfer material roller 35 forms a part of the transfer station 40 (together with the counterpressure roller 43), so that it is not possible to temporally and locally decouple the manufacturing of the conductor structures 5 and their transfer onto the foil material 2. In addition, the transport paths between printer 25 and sinter station 28, as well as between sinter station 28 and transfer station 40 are defined by the circumference of the roller 35. As heat source for sintering substantially a radiation source comes into consideration. Otherwise, the embodiment represented in FIG. 3 corresponds to the embodiment represented in FIG. 2.

Figure 4:
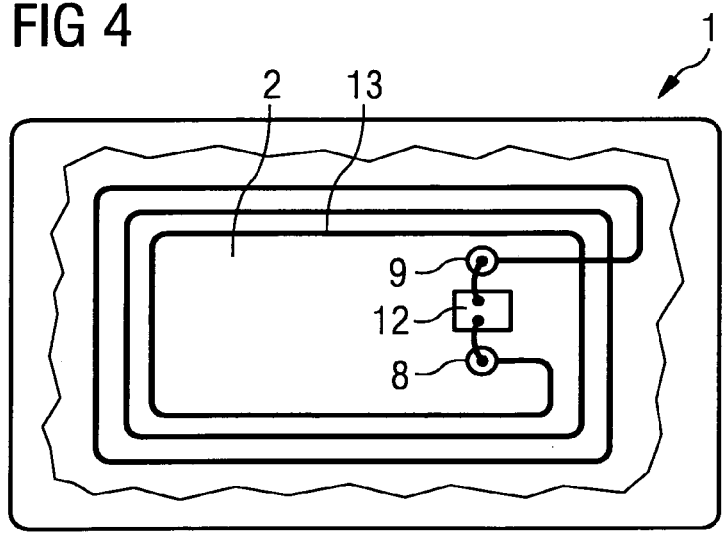
Figure 5:
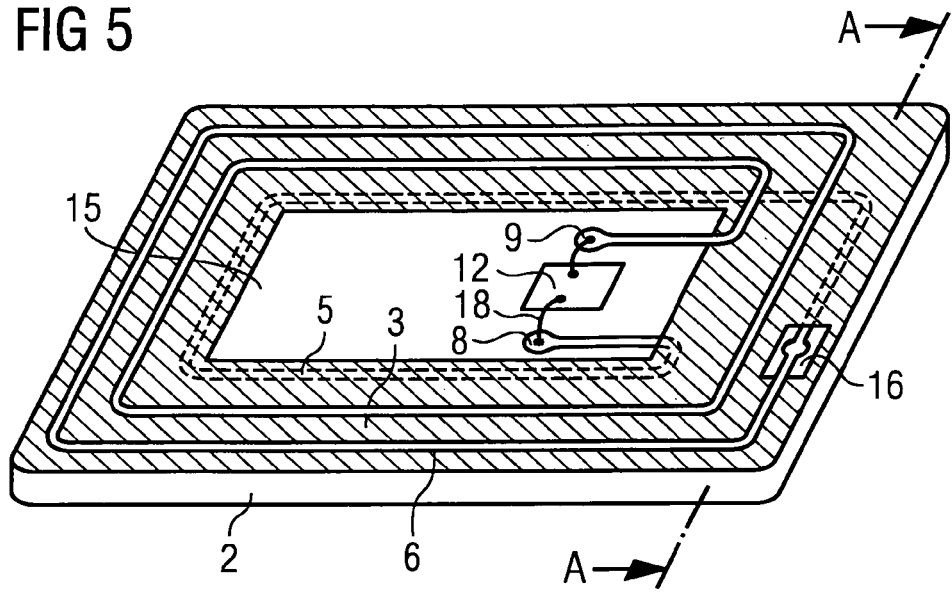

The FIGS. 4 and 5 show a chip card 1 in a top view and in a perspective view. The chip card 1 also has a coil, like the coil of FIG. 1 formed by the first conductor structure 5. The coil 13 of the chip card 1, however, consists of two coil layers which are separated by an insulating foil layer. The chip card 1 has a layer made of a first foil material 2, i.e. a first foil layer 2, a layer made of a second foil material 3, i.e. a second foil layer 3, and a layer made of a third foil material, i.e. a third foil layer, which is not represented in FIGS. 4 and 5. The foil layers each are electrically insulating plastic foils. Between the first foil layer 2 and the second foil layer 3 there is located the first conductor structure 5 which forms a first coil layer, and between the second foil layer 3 and the third foil layer there is located a second conductor structure 6 which forms a second coil layer. The second foil layer 3 has through openings 15, 16. The opening 16 serves to interconnect the first conductor structure 5 and the second conductor structure 6 in an electrically conductive fashion, as explained in more detail in FIG. 6. Therefrom results the "two-layer" coil 13. The contact window 16 in the intermediate layer 3, however, can also be omitted. Then, between the two coil layers there exists no electrically conductive connection. Instead, the coil layers are capacitively coupled.

The through opening 15 in the central region of the foil layer 3 serves to establish an electrically conductive connection between the ends 8, 9 of the coil 13 and an IC-chip 12. In particular, the end 8 of the first conductor structure 5 is located on the first foil layer 2, and it would be covered with a foil layer 3 without through opening 15. In the represented embodiment, the dimensions of the second foil layer or of the intermediate layer 3 are chosen such that the second foil layer 3 merely insulates the first conductor structure 5 from the second conductor structure 6, but does not cover the central region of the first foil layer 2. In the represented embodiment, the IC-chip 12 is accordingly located on a surface of the first foil layer 2. It is connected with the first conductor structure end 8 and the second conductor structure end 9 via bonding wires 18 in a per se known manner. Alternatively, however, also the second foil layer 3 can be formed all-over. In this case, also the integrated circuit 12 is capacitively coupled to the coil 13, analogous to the capacitive coupling of the first and of the second coil layer in the case of the absence of the contact window 16.

The manufacturing of the chip card 1 is effected by equipping the first foil material 2 with the first conductor structure 5 in accordance with the above-described sinter/transfer method of the invention, equipping the second foil material 3 or the third foil material with the second conductor structure 6 in accordance with the above-described sinter/transfer method of the invention, stacking the foil materials in such a way that the first conductor structure 5 is located between the first foil material 2 and the second foil material 3 and the second conductor structure 6 is located between the second foil material 3 and the third foil material, and hot-laminating the foil stack into the chip card 1.

When the second conductor structure 6 is located on the second foil material 3, a contact window 16 cannot be provided, and the coil layers are capacitively coupled. When the second conductor structure 6 is located on the third foil material, the second foil material 3 can have the contact window 16, and between the conductor structures 5, 6 there can be formed an electrically conductive connection, as represented in FIG. 6.

Figure 6:
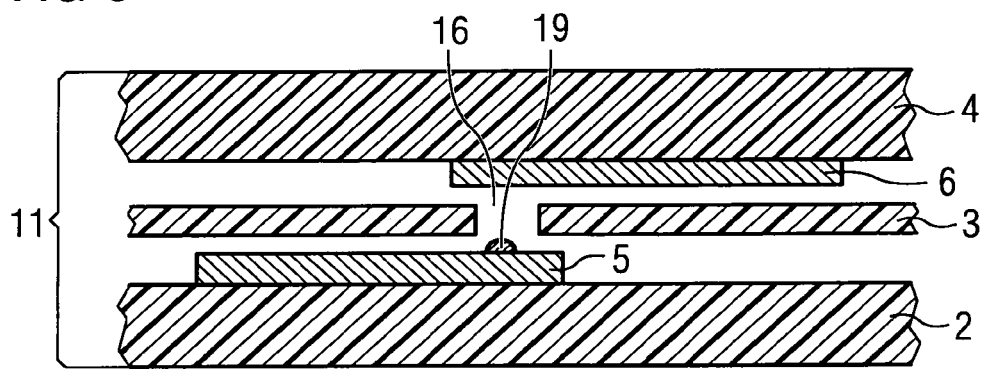

FIG. 6 shows a cross-section along the line A-A of FIG. 5. The cross-section illustrates the layer construction of the chip card and the electrically conductive connection between the coil layers 5, 6 through the contact window 16 of the intermediate layer 3. The coil layers 5, 6 overlap each other in the region of the contact window 16, and upon stacking the first foil material 2, the second foil material 3 and the third foil material 4, in order to laminate the layers into the laminate material 11, a small quantity of conductive adhesive 19 is applied in the region of the contact window 16 to one of the coil layers 5, 6. Upon lamination, the conductive adhesive 19 flows into the contact window 16 and establishes an electrically conductive connection between the conductor structures 5, 6.

The represented chip card 1 has merely three foil layers. But, of course, there can also be laminated on or lined on further foil layers, whereby these further foil layers can also have electrically conductive conductor structures, which are manufactured in accordance with the above-described sinter/transfer method of the invention or in accordance with another method. These further foil layers can be hot-laminated simultaneously with the remaining foil layers, or the hot lamination can be carried out in several steps, i.e with partial foil stacks.

The represented laminate materials having conductor structures of sintered metallic nanoparticles, combined with an electronic functional element or several electronic functional elements, typically are integrated as inlets into the layer construction of a card. Alternatively, already the final card construction can be manufactured in the manner stated herein by equipping foil material with conductor structures and subsequently laminating the foil materials.

Figure 7:
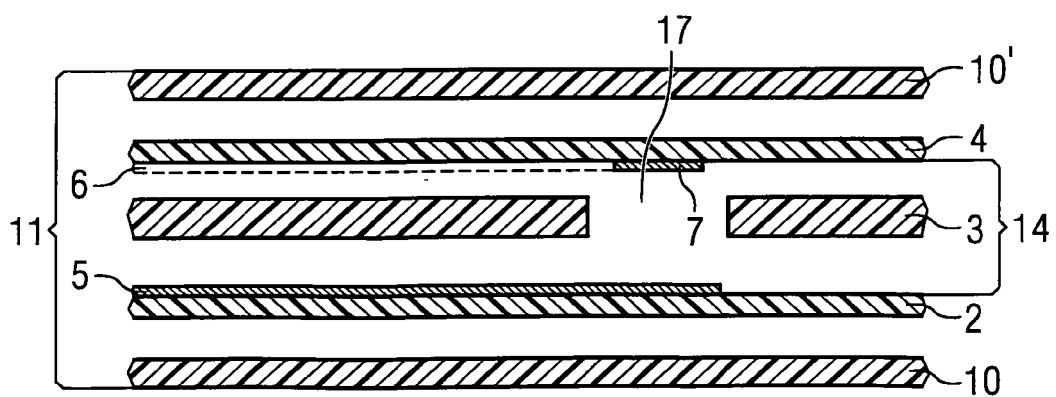
Figure 8A:
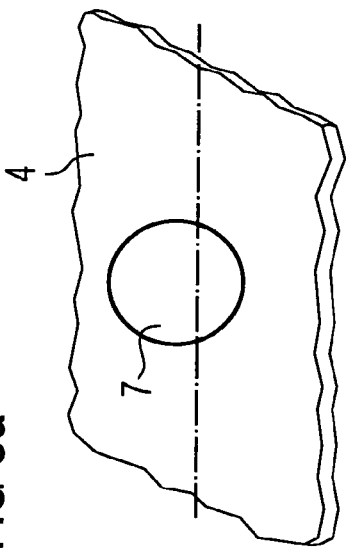
Figure 9A:
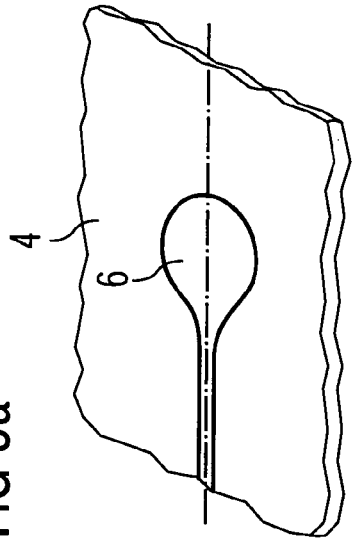

FIG. 7 shows a partial sectional view of a laminate material 11 according to the invention with a switch 14. The foil layers are represented in the state before the lamination, but in the required layer sequence and orientation to each other. The laminate material 11 has a first foil layer 2, a second foil layer 3 and a third foil layer 4 as well as further foil layers 10, 10'. On a surface of the foil layer 2 there is located a first conductor structure 5 manufactured by means of the sinter/transfer method of the invention. On a surface of the foil layer 4 there is located a further conductor structure also manufactured by means of the sinter/transfer method of the invention, which conductor structure can have different shapes, as shown in FIG. 8a and FIG. 9a. FIG. 8a shows a conductor structure 7 in the form of a conductive area without any connection to other conductor structures, and FIG. 9a shows a conductor structure 6 which is a combination of conductive area and conductor path. In FIG. 7, the conductor structure 7 is represented in continuous lines, while the conductor structure 6 is represented by dashed lines as an extension of the conductor structure 7.

The FIGS. 8a and 9a respectively show top views from below onto the conductor structures 7 and 6. The FIGS. 8b and 9b respectively show top views from above onto the conductor structures opposing the conductor structures 7 and 6, which are located on a surface of the foil 2. In the FIGS. 8b, 9b there is respectively also represented the intermediate layer 3 which separates the conductor structures on the foils 2 and 4, the "contact foils", from each other, but has a through opening 17 through which the opposing conductor structures can come in contact with each other. The contact is established through exerting a pressure on the elastic contact foils of the laminate material 11 in the region of the through opening 17 (of the switch window 17), and interrupted through terminating the pressure. When no more pressure is exerted, the elastic foils return to their initial states. With this arrangement, electronic functional elements can be switched on and off. The conductor structures are designed differently, depending on whether a contact between different levels of the laminate material is to be established or interrupted, or whether a contact in the same level is to be established or interrupted.

Figure 8B:
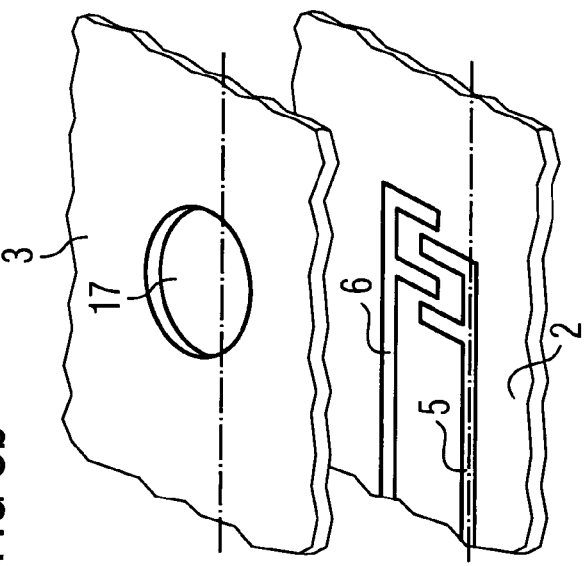

FIG. 8 relates to the establishing/interruption of an electrical contact between conductor structures in the same level. A first conductor structure 5 and a second conductor structure 6 (FIG. 8b) can be electrically conductively interconnected by means of a third conductor structure 7 (FIG. 8a).

Figure 9B:
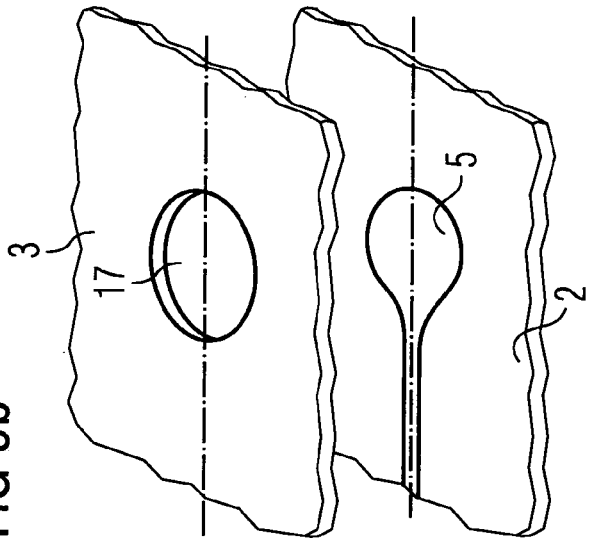

FIG. 9 relates to the establishing/interruption of an electrical contact between conductor structures in different levels. A first conductor structure 5 (FIG. 9b) can be electrically conductively connected with a second conductor structure 6 (FIG. 9a). The conductor structures 5, 6 and 7 (FIG. 8) and the conductor structures 5 and 6 (FIG. 9) respectively form together a switch 14. The manufacturing of such a laminate material 11 having a switch 14 is again effected by equipping foil material 2 and 4 with the corresponding conductor structures 5, 6 and 7 (FIG. 8) or with the conductor structures 5 and 6 (FIG. 9) in accordance with the sinter/transfer method of the invention, stacking the foil materials 2 and 4 equipped with the conductor structures as well as further foil materials 3, 10 and 10', in the order and orientation to each other as represented in FIG. 7, into a foil stack, and then hot-laminating the foil stack so as to form the laminate material 11.

Laminate materials, such as the one shown in FIG. 7, are suitable for example for manufacturing foil keyboards.

Of course, there can also be combined several functions in the laminate materials. For example, conductor paths of most different forms, one- or multi-layered coils, and switches can be contained in one and the same laminate material. The conductor structures produced according to the invention by means of nano-inks in the sinter/transfer method are suitable very well for contacting IC-chips, as they show very low contact resistances on usual bonding pads made of gold or platinum. Conductor structures in different levels of a laminate material can be manufactured with the help of the same or of different nano-inks.

The particular advantages of the conductor structures manufactured from nano-inks in the sinter/transfer method according to the invention, compared to unsintered conductor structures made of the same nano-ink, include in particular a utilization of the metallic material improved by up to 50% regarding conductivity, a reduction in the thickness of the conductor structures of up to 50%, which results in advantages in the optical appearance of chip cards, and furthermore makes possible an inconspicuous accommodation of electrically conductive structures in value documents, a reduction of the process duration by a factor of about 10, and an optimal checkability of the electrical properties of the conductor structures, in particular coils, before the further processing, in particular before the chip insertion.

The invention claimed is:

1. A foil material comprising at least one electrically conductive conductor structure, wherein the electrically conductive conductor structure comprises sintered metallic nanoparticles and is obtained by:

(a) applying a dispersion, containing metallic nanoparticles, in a form which corresponds to the form of the conductor structure to be formed, to a surface of a transfer material to provide a precursor conductor structure formed by the nanoparticles, (b) sintering the metallic nanoparticles forming the precursor conductor structure by supplying heat to the nanoparticles so as to form the electrically conductive conductor structure on the surface of the transfer material, wherein the sintering of the nanoparticles forming the precursor conductor structure into the electrically conductive conductor structure is effected at a temperature of at least 250° C., and within a time of no more than 30 seconds, such that the electrically conductive conductor structure has a conductivity of 20% to 50% the conductivity of a corresponding solid material without adding additional material, (c) bringing into contact a surface of the foil material and the surface of the transfer material on which the electrically conductive conductor structure is located, (d) transferring the electrically conductive conductor structure from the surface of the transfer material onto the contacting surface of the foil material by exerting pressure, wherein the electrically conductive conductor structures are secured to the contacting surface of the foil material by a tack-free adhesive coating layer provided on the foil material, and (e) where applicable, detaching segments of a desired size from the foil material, a segment having at least one electrically conductive conductor structure;

wherein the steps (c), (d) and, where applicable, (e) are carried out immediately subsequent to the steps (a) and (b) or at any later point in time;

wherein the foil material has a thickness of 500 µm or less and the electrically conductive conductor structures have a thickness in the range of 1 to 25 µm;

wherein the foil material is provided with the electrically conductive conductor structures and the tack-free adhesive coating layer on two surfaces;

wherein the tack-free adhesive coating layer comprises a different material than the foil material, the different material including a polyurethane;

wherein the dispersion includes an acrylate epoxy matrix that increases the adhesion of the electrically conductive conductor structure to the foil material; and wherein the foil material is wound in a storage roll such that the tack-free adhesive coating layer secures the electrically conductive conductor structures to the contacting surface of the foil material and contacts the tack-free adhesive layer on an opposite surface of the foil material without sticking.

2. A foil material according to claim 1, wherein the transfer material includes a band made of metal or of a high-temperature-resistant plastic or of a material coated with a high-temperature-resistant plastic.

3. A foil material according to claim 1, wherein the transfer material includes a roller made of metal or of a high-temperature-resistant plastic or a roller coated with a high-temperature-resistant plastic or metal.

4. A foil material according to claim 1, wherein the dispersion containing nanoparticles is an aqueous dispersion or a solvent-based dispersion with a content of nanoparticles of 10 wt % to 30 wt % and/or with an average particle diameter of the nanoparticles of 20 nm to 1000 nm, wherein the nanoparticles are particles of pure metals or of metal alloys.

5. A foil material according to claim 1, wherein the application of the dispersion containing metallic nanoparticles is effected by a printing method.

6. A foil material according to claim 1, wherein as the foil material to be provided with the conductor structures there is employed a hot-laminatable foil material.

7. A foil material according to claim 1, wherein the foil material's surface to be provided with the electrically conductive conductor structure is pretreated in adhesion-enhancing fashion or coated in adhesion-enhancing fashion to improve the adhesion to the conductor structure and/or the surface of the transfer material is pretreated or coated in adhesion-reducing fashion to reduce the adhesion to the electrically conductive conductor structure.

8. A foil material according to claim 1, wherein the foil material has a thickness of 100 µm or less.

9. A foil material according to claim 1, wherein a ratio of conductance of the electrically conductive conductor structures to the foil material is at least 1:1,000,000.

10. A foil material according to claim 1, wherein the foil material is a polyester foil, polycarbonate foil, polyolefin foil, or polyamide foil.

11. A foil material according to claim 1, wherein the foil material is a PVC foil.

12. A foil material according to claim 1, wherein the electrically conductive conductor structures are continuous metallic structures.

13. A foil material according to claim 12, wherein the at least one electrically conductive conductor structure comprises silver, aluminum or a copper-nickel alloy.

14. A foil material according to claim 12, wherein the at least one electrically conductive conductor structure comprises silver.

15. A foil material comprising at least one electrically conductive conductor structure, wherein the electrically conductive conductor structure comprises sintered metallic nanoparticles and is obtained by:

(a) applying a dispersion, containing metallic nanoparticles, in a form which corresponds to the form of the conductor structure to be formed, to a surface of a transfer material to provide a precursor conductor structure formed by the nanoparticles, (b) sintering the metallic nanoparticles forming the precursor conductor structure by supplying heat to the nanoparticles so as to form the electrically conductive conductor structure on the surface of the transfer material, wherein the sintering of the nanoparticles forming the precursor conductor structure into the electrically conductive conductor structure is effected at a temperature of at least 250° C., and within a time of no more than 30 seconds, such that the electrically conductive conductor structure has a conductivity of 20% to 50% the conductivity of a corresponding solid material without adding additional material, (c) bringing into contact a surface of the foil material and the surface of the transfer material on which the electrically conductive conductor structure is located, (d) transferring only the electrically conductive conductor structure from the surface of the transfer material onto the contacting surface of the foil material by exerting pressure, wherein the electrically conductive conductor structures are secured to the contacting surface of the foil material by a tack-free adhesive coating layer provided on the foil material, and (e) where applicable, detaching segments of a desired size from the foil material, a segment having at least one electrically conductive conductor structure;

wherein the steps (c), (d) and, where applicable, (e) are carried out immediately subsequent to the steps (a) and (b) or at any later point in time;

wherein the foil material has a thickness of 500 µm or less and the electrically conductive conductor structures have a thickness in the range of 1 to 25 µm;

wherein the tack-free adhesive coating layer comprises a different material than the foil material, the different material including a polyurethane;

wherein the electrically conductive conductor structures consist of continuous metallic structures formed from silver nanoparticles; and wherein the foil material is wound in a storage roll such that the electrically conductive conductor structures are secured to the contacting surface of the foil material and contact an opposite surface of the foil material.

* * * * *